United States Patent
Poelzl et al.

(10) Patent No.: US 8,803,230 B2
(45) Date of Patent: Aug. 12, 2014

(54) SEMICONDUCTOR TRANSISTOR HAVING TRENCH CONTACTS AND METHOD FOR FORMING THEREFOR

(75) Inventors: Martin Poelzl, Ossiach (AT); Georg Ehrentraut, Villach (AT)

(73) Assignee: Infineon Technologies Austria AG, Villach (AT)

(*) Notice: Subject to any disclaimer, the term of this patent is extended or adjusted under 35 U.S.C. 154(b) by 194 days.

(21) Appl. No.: 13/350,972

(22) Filed: Jan. 16, 2012

(65) Prior Publication Data

US 2013/0181281 A1 Jul. 18, 2013

(51) Int. Cl.
*H01L 21/336* (2006.01)
*H01L 29/66* (2006.01)

(52) U.S. Cl.
USPC .......................... 257/330; 438/270

(58) Field of Classification Search
CPC .................. H91L 2/407; H91L 29/42369
USPC .............................. 537/330; 438/270
See application file for complete search history.

(56) References Cited

U.S. PATENT DOCUMENTS

| | | | |
|---|---|---|---|
| 6,916,745 B2 | 7/2005 | Herrick et al. | |
| 8,274,113 B1* | 9/2012 | Hsieh | 257/334 |
| 2009/0020810 A1* | 1/2009 | Marchant | 257/331 |
| 2010/0072544 A1* | 3/2010 | Pearse et al. | 257/331 |
| 2010/0140695 A1* | 6/2010 | Yedinak et al. | 257/334 |
| 2011/0037120 A1* | 2/2011 | Chen et al. | 257/331 |
| 2011/0095360 A1 | 4/2011 | Krumrey et al. | |
| 2011/0291186 A1* | 12/2011 | Yilmaz et al. | 257/334 |

* cited by examiner

*Primary Examiner* — Matthew Landau
*Assistant Examiner* — Igwe U Anya
(74) *Attorney, Agent, or Firm* — Murphy, Bilak & Homiller, PLLC

(57) ABSTRACT

Embodiments described herein relate to semiconductor transistors having trench contacts, in particular to semiconductor transistors having a field electrode below a gate electrode, and to related methods for producing semiconductor transistors having trench contacts.

23 Claims, 15 Drawing Sheets

SEMICONDUCTOR TRANSISTOR HAVING TRENCH CONTACTS AND METHOD FOR FORMING THEREFOR

TECHNICAL FIELD

Embodiments of the present invention relate to semiconductor transistors having trench contacts, in particular to semiconductor transistors having a field electrode below a gate electrode, and to related methods for producing semiconductor transistors having trench contacts.

BACKGROUND

Semiconductor transistors, in particular field-effect controlled switching devices such as a Metal Oxide Semiconductor Field Effect Transistor (MOSFET) or an Insulated Gate Bipolar Transistor (IGBT) have been used for various applications including but not limited to use as switches in power supplies and power converters, electric cars, air-conditioners, and even stereo systems. Particularly with regard to power devices capable of switching large currents and/or operating at higher voltages, low switching losses are often desired. In order to reduce switching losses, there are ongoing developments to reduce distances between neighboring unit cells of power devices. For example, the lateral distance between a trench gate electrode and the contact to source region and body region of the transistor may be reduced. However, this may require a high-precision deep UV-technology and a further contact layer with tight alignment tolerances. Therefore, manufacturing of such devices is often very complex and costly.

Accordingly, there is a need to provide reliable and cost-effective methods for forming contacts of semiconductor transistors.

SUMMARY

According to an embodiment of a method for producing a semiconductor transistor component, the method includes: providing a semiconductor body with a first surface defining a vertical direction, defining an active area, a first contact area and a second contact area. Vertical trenches are formed in the semiconductor body such that in a vertical cross-section which is substantially orthogonal to the first surface a first vertical trench, a second vertical trench and a third vertical trench extend from the first surface into the semiconductor body. The first vertical trench is formed in the active area. The second vertical trench is formed in the first contact area. The third vertical trench is formed in the second contact area. The method further includes forming respective first conductive regions in the second vertical trench and in a lower portion of the first vertical trench, so that the first conductive region in the second vertical trench extends above the first surface. Respective second conductive regions are formed in an upper portion of the first vertical trench and in an upper portion of the third vertical trench. An insulation layer is formed in the first vertical trench, in the third vertical trench and on the first surface so that the insulation layer has a first recess above the second conductive region of the first vertical trench, a second recess above the second conductive region of the third vertical trench and a protrusion above the first conductive region of the second vertical trench. A polycrystalline semiconductor layer is deposited on the insulation layer. The polycrystalline semiconductor layer is anisotropic etched to partly recess the insulation layer in the second recess while the insulation layer beneath the first recess remains covered.

According to an embodiment of a method for producing a semiconductor component, the method includes providing a semiconductor arrangement comprising a semiconductor body with a first surface, and forming a first vertical trench, a second vertical trench and a third vertical trench from the first surface into the semiconductor body so that, in a vertical cross-section which is substantially orthogonal to the first surface, the first vertical trench has a first width, the second vertical trench has a second width, and the third vertical trench has a third width which is larger than at least one of the first width and the second width. The method further includes forming a first contact electrode in the second vertical trench that extends above the first surface, forming at least in a lower portion of the first vertical trench a field electrode that is, in the vertical cross-section, completely insulated. Forming the first contact electrode and forming the field electrode includes a common process of depositing a conductive material. The method further includes: forming a gate electrode in an upper portion of the first vertical trench and a gate contact electrode in an upper portion of the third vertical trench; depositing an insulation layer on the first surface so that the insulation layer includes a first recess above the gate electrode, a second recess above the gate contact electrode and a protrusion above the first contact electrode; depositing a mask layer on the insulation layer which is selectively etchable with respect to the insulation layer; and etching the mask layer with respect to the insulation layer such that the insulation layer is partly recessed on the protrusion and in a central portion of the second recess while the insulation layer beneath the first recess remains covered by the mask layer.

According to an embodiment of a semiconductor transistor, the semiconductor transistor includes a semiconductor body with a first surface defining a vertical direction. In a vertical cross-section the semiconductor transistor further includes an active area, a first contact area and a second contact area. The active area includes at least a first vertical trench of a first width extending from the first surface into the semiconductor body and having in a lower portion a field electrode and in an upper portion a gate electrode. The first contact area includes at least a second vertical trench extending from the first surface into the semiconductor body. The at least one second vertical trench has a second width and includes a first contact electrode that extends above the first surface. The first contact electrode is in electric contact with the field electrode. The second contact area includes a third vertical trench extending from the first surface into the semiconductor body. The third vertical trench includes a gate contact electrode in electric contact with the gate electrode. The third vertical trench has a third width which is larger than at least one of the first width and the second width.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
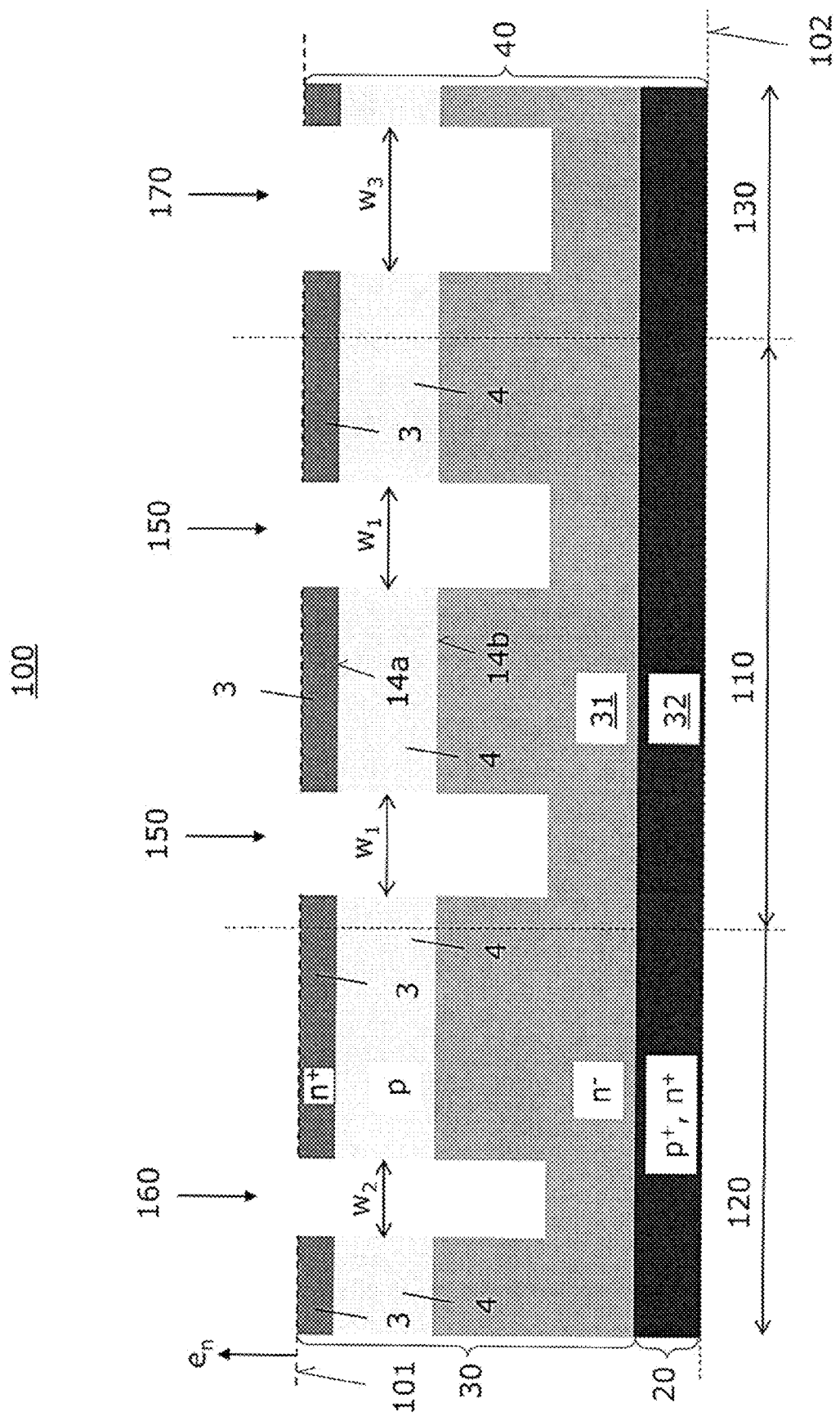
FIGS. 1 to 9 illustrate vertical cross-sections through a semiconductor body during method steps of a method according to embodiments.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, methods for forming semiconductor transistor devices or components, in particular to methods for forming field effect transistor devices. Within this specification the terms "semiconductor device" and "semiconductor component" are used synonymously. The formed semiconductor device is typically a vertical semiconductor device such as a vertical IGBT or a vertical MOSFET with an insulated field electrode arranged in a vertical trench and an insulated gate electrode arranged in the vertical trench and above the insulated field electrode. Typically, the formed semiconductor device is a power semiconductor device having an active area for carrying and/or controlling a load current and a peripheral area. In the peripheral area a first and a second contact area are typically formed.

The term "power semiconductor device" as used in this specification intends to describe a semiconductor device on a single chip with high voltage and/or high current switching capabilities. In other words, power semiconductor devices are intended for high current, typically in the Ampere range. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistivity contact with a drain or collector electrode. The source region or emitter region is in ohmic contact with a source or emitter electrode.

In the context of the present specification, the term "gate electrode" intends to describe an electrode which is situated next to, and insulated from the body region and configured to form and/or control a channel region.

In the context of the present specification, the terms "field plate" and "field electrode" intend to describe an electrode which is arranged next to a semiconductor region, typically the drift region, insulated from the semiconductor region, and configured to expand a depleted portion in the semiconductor region by applying an appropriate voltage, typically a negative voltage for an n-type drift region.

In the context of the present specification, the term "mesa" or "mesa region" intends to describe a semiconductor region between two adjacent trenches extending into the semiconductor substrate or body in a vertical cross-section.

FIGS. 1 to 9 illustrate a method for forming a semiconductor device 100 according to several embodiments in vertical cross-sections. These figures show vertical cross-sections through a semiconductor body during or after particular method steps. In a first process, a semiconductor body 40, for example a wafer or substrate 40, having a first surface 101 and a second surface 102 opposite the first surface 101 is provided. The normal direction $e_n$ of the first surface 101 is substantially parallel to the vertical direction.

The semiconductor body 40 can be a single bulk mono-crystalline material. It is also possible that the semiconductor body 40 includes a bulk mono-crystalline material 20 and at least one epitaxial layer 30 formed thereon. Using the epitaxial layer(s) 30 provides more freedom in tailoring the background doping of the material since the doping concentration can be adjusted during deposition of the epitaxial layer or layers.

In the exemplary embodiment illustrated in FIG. 1, the semiconductor body 40 includes a $p^+$-type or a $n^+$-type semiconductor layer 32 extending to the second surface 102, an $n^-$-type semiconductor layer 31 arranged on semiconductor layer 32, a p-type semiconductor layer 4 arranged on semiconductor layer 31 and an $n^+$-type semiconductor layer 3 arranged on p-type semiconductor layer 4 and extending to the first surface 101. The doping relations may also be reversed. A first pn-junction 14a and a second pn-junction 14b which extend, at least in an active area 110, substantially parallel to the first surface 101 are formed between semiconductor layers 3 and 4 and between semiconductor layer 4 and 31, respectively. In the semiconductor device 100 to be produced, semiconductor layer 31 and semiconductor layer 4 form a drift region 31 and a body region 4, respectively. In a finally formed MOSFET structure, $n^+$-type semiconductor layer 32 and portions of $n^+$-type semiconductor layer 3 form a drain region and source regions, respectively. In a finally formed IGBT structure, $p^+$-type semiconductor layer 32 and portions of $n^+$-type semiconductor layer 3 form a collector region and emitter regions, respectively. Typically, further pt-type contact regions extending, for example, between semiconductor layer 4 and first surface 101 are also formed for contacting the body regions 4. For sake of clarity, the pt-type contact regions are however not shown in the Figures. For example, the pt-type contact regions may only be formed in a different vertical cross-section.

In the following, embodiments pertaining to manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body 40 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-resistance $R_{on}$.

Referring again to FIG. 1, the active area 110, a first contact area 120 and a second contact area 130 are defined for the semiconductor device 100. Typically, the first contact area 120 and the second contact area 130 are defined in a peripheral area of the semiconductor body 40 or between the active area 110 and the peripheral area extending to an edge of the semiconductor body 40. In a later process the peripheral area may further be used for forming additional edge termination structures such as field plates arranged on the first surface 101, field rings, VLD structures (variation of lateral doping) or the like to increase the break down voltage of the semiconductor device 100 when the pn-junction 14b is reverse biased.

In the exemplary embodiment illustrated in FIG. 1, two first vertical trenches 150, a second vertical trench 160 and a third vertical trench 170 are etched from the first surface 101 into the semiconductor body 40 using a mask (not shown in FIG. 1). Typically, a plurality of first vertical trenches 150 is formed in the active area 110. The second vertical trench 160 and the third vertical trench 170 are formed in the first contact area 120 and the second contact area 130, respectively. Forming the first, second and third vertical trenches 150, 160, 170 typically include a common etching process. Furthermore, the first, second and third vertical trenches 150, 160, 170 shown in the vertical cross-section of FIG. 1 typically correspond to respective portions 150, 160, 170 of a common trench. Accordingly, electrodes to be formed in the first vertical trenches 150 may be contacted via conductive regions deposited in the second and third vertical trenches 160, 170 in the contact areas 120, 130.

Typically, the first, second and third vertical trenches 150, 160, 170 are etched into the semiconductor body 40 so that the trenches 150, 160, 170 partially extend into semiconductor layer 31 later typically forming a drift region. Semiconductor layers 3 and 4 may also be formed after forming the first, second and third vertical trenches 150, 160, 170. The first, second and third vertical trenches 150, 160, 170 may have substantially the same vertical extension.

In the vertical cross-section, the third vertical trench 170 typically has a third width $w_3$, i.e. a horizontal extension, which is larger than a first width $w_1$ of the first vertical trenches 150 and/or a second width $w_2$ of the second vertical trench 160. For example, the third width $w_3$ of the third vertical trench 170 is equal to or larger than about two times the first width $w_1$ of the first vertical trenches 150 and/or equal to or larger than about two times the second width $w_2$ of the second vertical trench 160. Furthermore, the second width $w_2$ is typically chosen smaller than the first width $w_1$.

In the example, the first, second and third vertical trenches 150, 160, 170 have a rectangular cross section in the vertical plane. According to one embodiment sidewalls of the vertical trenches 150, 160, 170 are tapered (not illustrated) so that vertical trenches 150, 160, 170 narrow with increasing depths. Further edges between sidewalls and a bottom of the vertical trenches 150, 160, 170 could be rounded. In these embodiments, the widths $w_1$, $w_2$, $w_3$ typically correspond to the maximum horizontal extension of the respective vertical trenches 150, 160, 170.

Figure 2:
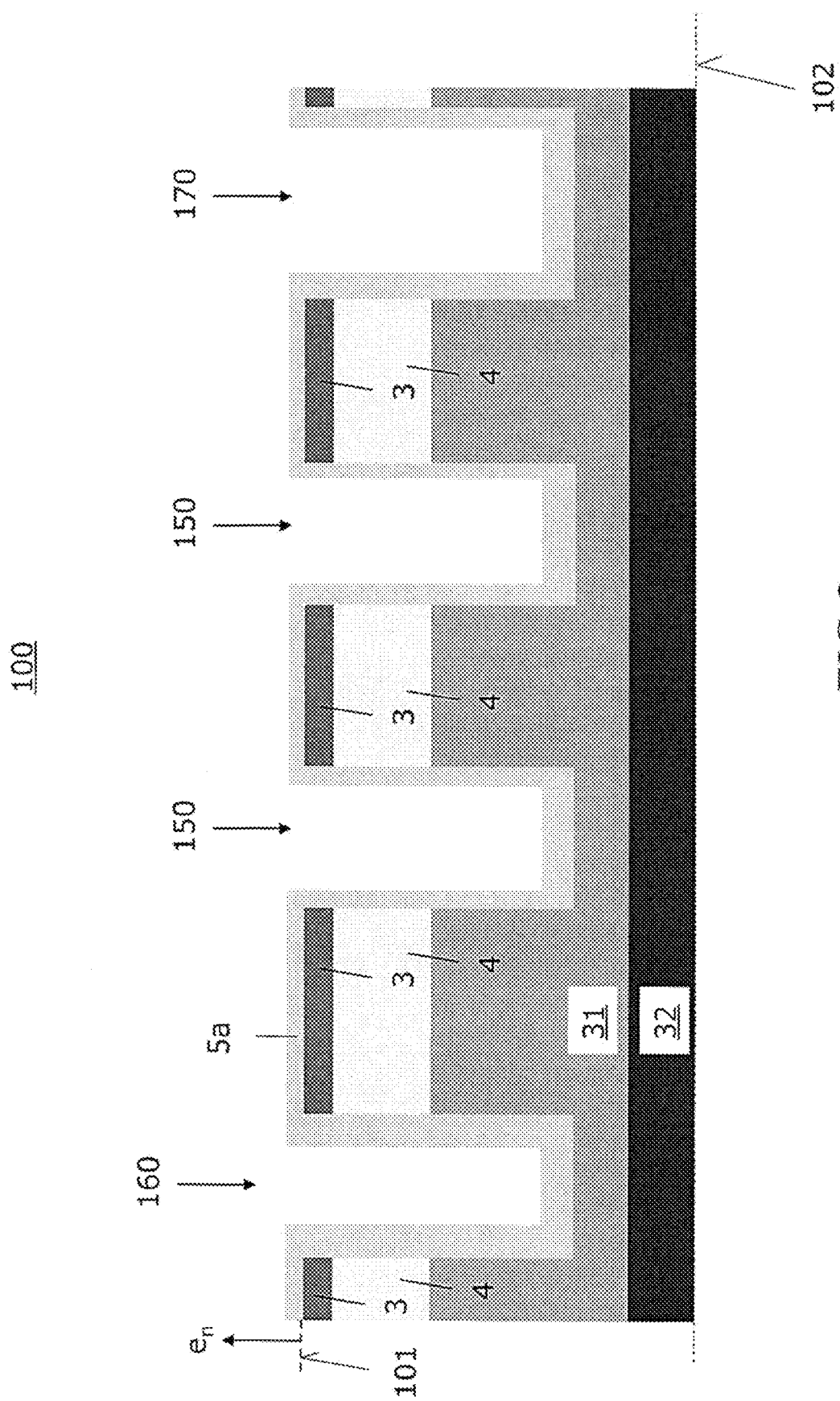

Referring to FIG. 2, an insulation layer 5a is formed on the first surface 101 and the bottom and side walls of the first, second and third vertical trenches 150, 160, 170. The insulation layer 5a may be formed by deposition or by thermal oxidation. Typically, the insulation layer 5a is formed as an oxide layer.

Figure 3:
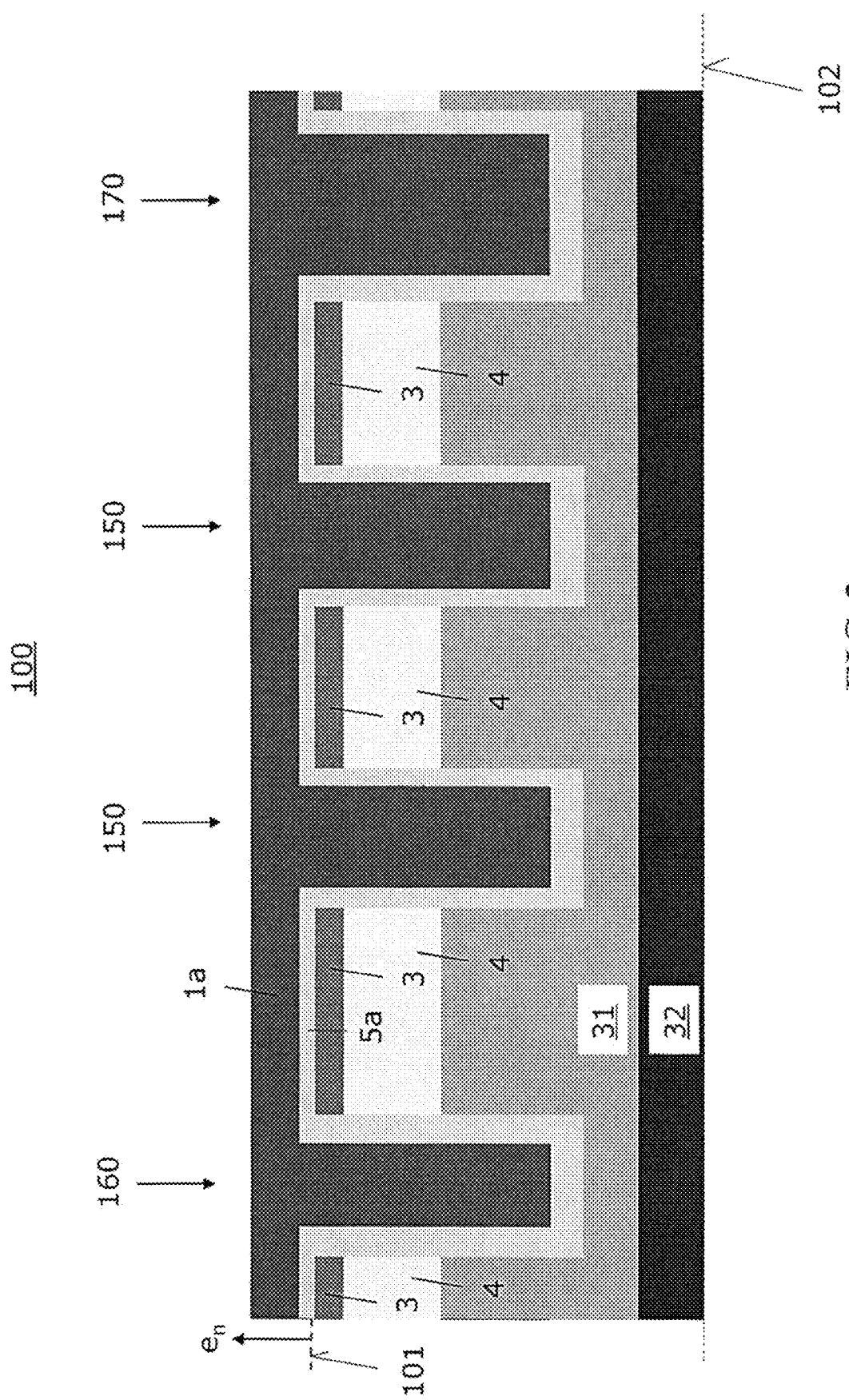

Referring to FIG. 3, a doped polycrystalline semiconductor material, typically doped poly-silicon, is deposited to at least completely fill the first, second and third vertical trenches 150, 160, 170. The polycrystalline semiconductor material is deposited such that a conductive layer 1a is formed which extends above the first surface 101, at least above the second vertical trench 160.

Thereafter, the conductive layer 1a is etched back such that first conductive regions 1, 1" are formed in lower portions of the first vertical trenches 150 and the third vertical trench 170, respectively, and such that a first conductive region 1' is formed in the second vertical trench 160 which extends above the first surface 101. This may be done by an anisotropic etching process using a mask covering at least a central portion of the second vertical trench 160. Accordingly, a connected first conductive region 1, 1', 1" with conductive first portions 1, 1', 1" is formed. In the finally formed semiconductor device 100, the first portions 1 arranged in the first vertical trenches 150 and the first portions 1" arranged in the third vertical trenches 170 typically form field electrodes 1, 1" which are connected via the first conductive region 1' arranged in the second vertical trench 160 and forming a first contact electrode 1' to a first metallization or first terminal arranged on the first surface 101.

Thereafter, a further dielectric layer is formed at least on the field electrodes 1, 1". The further dielectric layer in the component to be produced will be arranged between the field electrodes 1, 1" and a gate electrode and a gate contact electrode, respectively. Typically, the further dielectric layer is also formed on the first conductive region 1' arranged in the second vertical trench 160. Accordingly, the first conductive regions or portions 1, 1', 1" are completely insulated in the vertical cross-section. Forming the further dielectric layer may involve a deposition process that deposits a dielectric material on the first surface 101 of the semiconductor body 40 and on the field electrode 1, 1', 1". Typically, the deposition process has a higher deposition rate on horizontal surfaces than on vertical surfaces such as the sidewalls of the vertical trench 150, 160. Alternatively, the further dielectric layer may be formed by thermal oxidation. The further dielectric layer may at least partly be removed from the sidewalls of upper portions of the vertical trenches 150, 160. Thereafter, a gate dielectric may be formed on the sidewalls of the upper portions of the vertical trenches 150, 160. The gate dielectric is, for example, formed by a thermal oxidation process.

Figure 4:
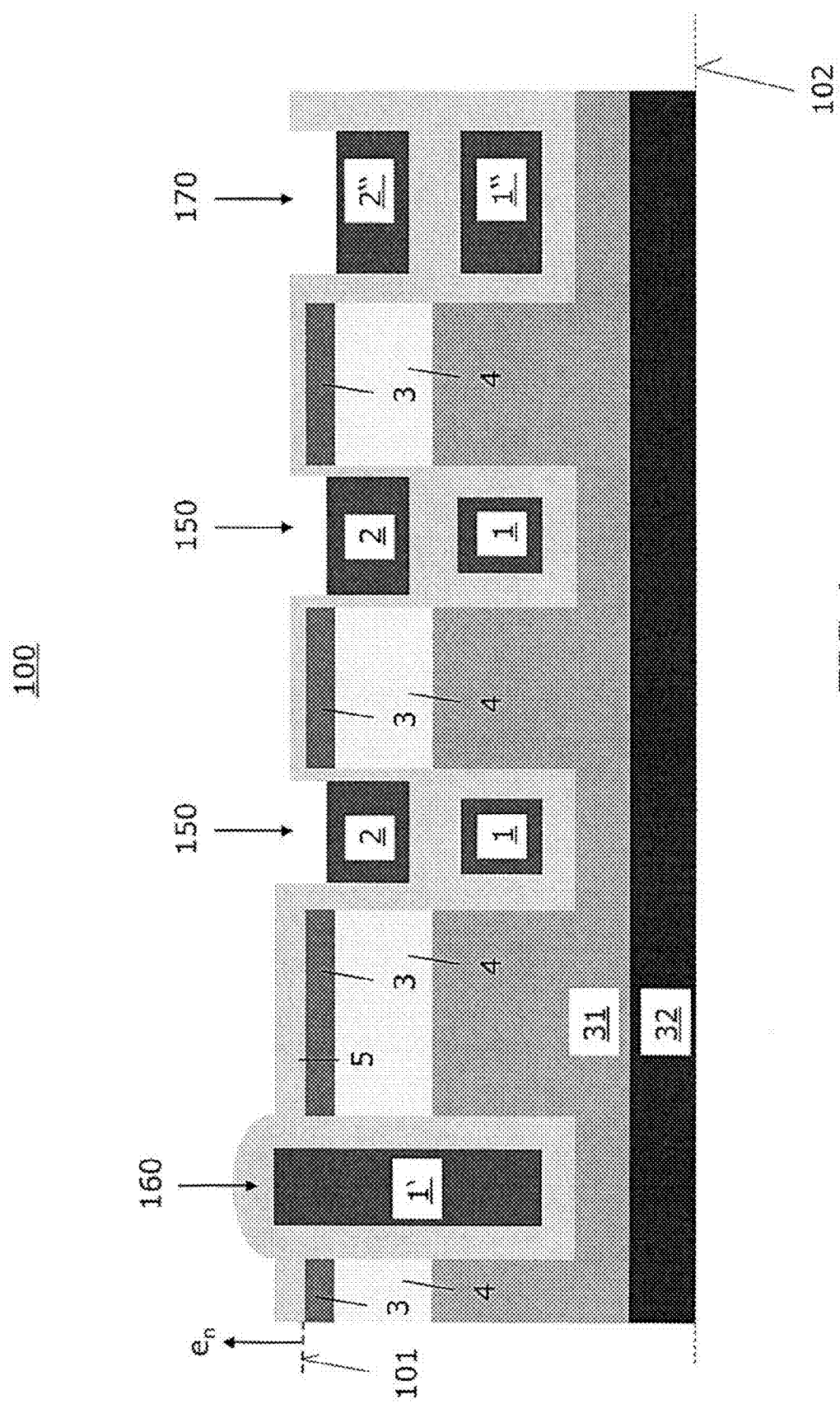

Thereafter, doped polycrystalline semiconductor material, typically doped poly-silicon, is again deposited from the first surface 101 and partly etched back to form second conductive regions 2, 2" on each of the dielectrically covered first conductive regions 1 of the first vertical trenches 150 and the dielectrically covered first conductive regions 1" of the third vertical trench 170. The resulting semiconductor structure is illustrated in FIG. 4. For sake of clarity, only one dielectric region 5 is illustrated in FIG. 4. Dielectric region 5 is formed by remaining portions of insulation layer 5a, the further dielectric layer and by the gate dielectric.

The second conductive regions 2, 2" typically form a common conductive region in a different vertical cross-section. In the component to be produced, the second conductive regions 2 of the first vertical trenches 150 typically form gate electrodes 2 that are connected via a gate contact electrode 2" formed in the third vertical trench 170 to a gate metallization arranged on the first surface 101.

The second conductive regions 2, 2" are typically formed such that they are completely arranged in upper portions of the first vertical trenches 150 and the second vertical trench 170, respectively. More typically, uppermost portions of the first vertical trenches 150 and the second vertical trench 170 are exposed by partially back-etching.

Since the second vertical trench 170 is typically wider than the first vertical trenches 150, using a common etching process for forming the second conductive regions 2, 2" results in a semiconductor structure 100 in which the gate contact electrode 2' has a larger minimum distance to the first surface 101 than the gate electrode 2.

The processes explained above with regard to FIGS. 1 to 4 may also be described as providing a semiconductor arrangement having a semiconductor body 40 with a first surface 101, a first vertical trench 150 of a first width in an active area 110, a second vertical trench 160 of a second width in a first contact area 120 and a third vertical trench 170 of a third width in a second contact area 130 and extending from the first surface 101 into the semiconductor body 40, wherein the third width is larger than at least one of the first width and the second width. The second vertical trench 160 includes a first contact electrode 1' that extends above the first surface 101 and is, in a vertical cross-section, completely insulated. In a lower portion of the first vertical trench 150 and in a lower portion of the third vertical trench 170 a field electrode 1, 1" is formed that is, in the vertical cross-section, completely insulated. Forming the first contact electrode 1' and forming the field electrodes 1, 1' includes a common process of depositing a conductive material such as doped poly-silicon. A gate electrode 2 is formed on the field electrode 1 of the first vertical trench 150 and a gate contact electrode 2" is formed on the field electrode of the third vertical trench 170. This process typically includes a common process of depositing a conductive material such as doped poly-silicon and/or a common back-etching process.

Figure 5:
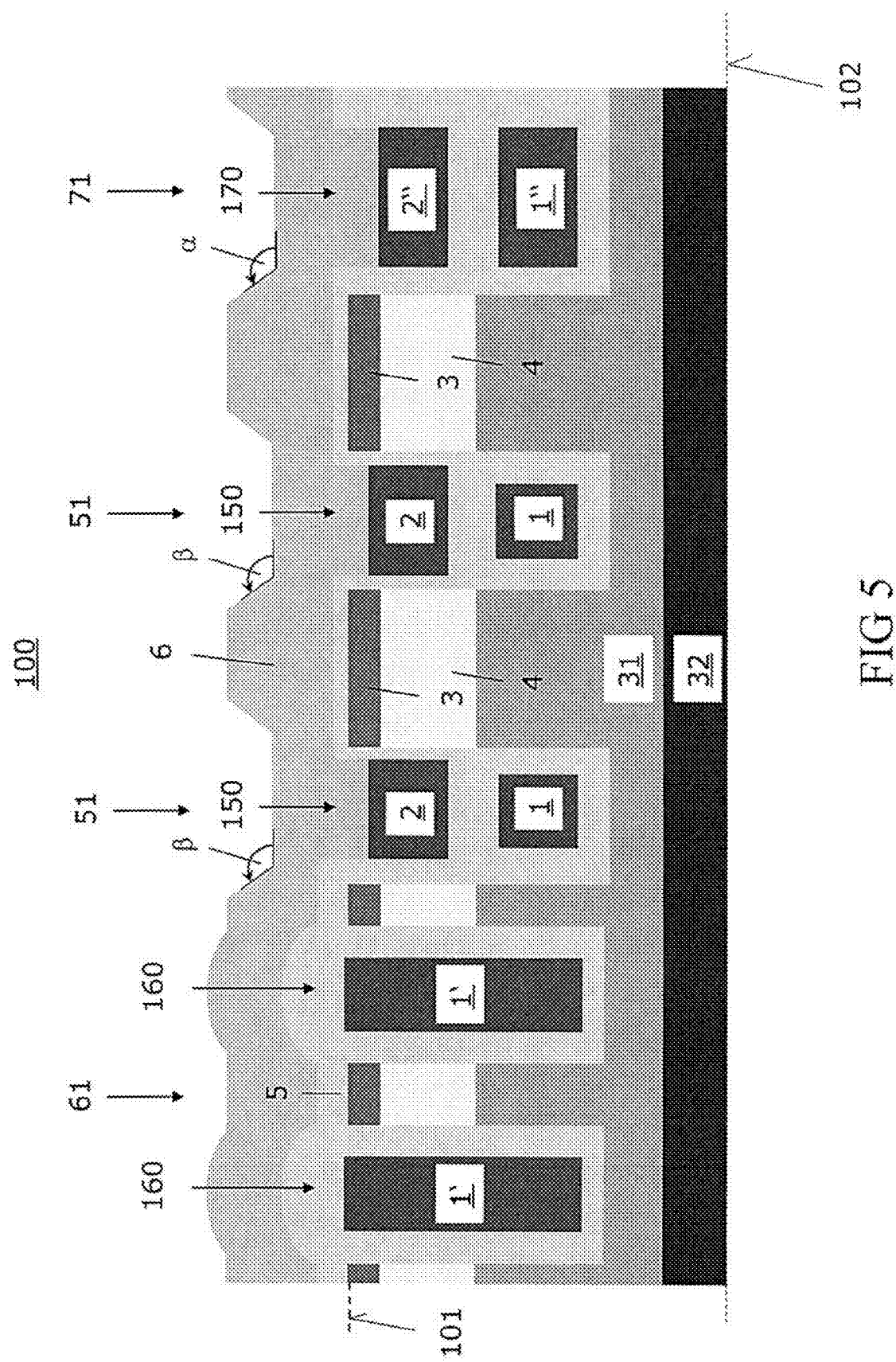

Referring to FIG. 5, an insulation layer 6 is formed on the gate electrode 2, the gate contact electrode 2" and on the first surface 101 so that the insulation layer 6 has first recesses or indentations 51 above the gate electrode 2, and a second recess 71 above the gate contact electrode 2". Further, a protrusion is formed above the first contact electrode 1. A vertical extension of the protrusion may, for example, be about 100 nm. In the exemplary embodiment illustrated in FIG. 5, two second vertical trenches 160 with two first contact electrodes 1' are illustrated. Accordingly, the insulation layer 6 has also a recess 61 between the respective protrusions of the insulation layer 6 above the first contact electrodes 1'.

Recess 71 above gate contact electrode 2" has, in the vertical cross-section, a bottom wall and a side wall forming with the bottom wall an angle α. Likewise, each of the first recesses 51 above the gate electrodes 2 has, in the vertical cross-section, a bottom wall and a side wall forming with the bottom wall an angle β. Typically, the insulation layer 6 is formed such that the angle α is in a range from about 120° to about 150°. Furthermore, angle β may substantially match angle α.

A deposition process used for forming the insulation layer 6 may be a selective deposition process having a deposition rate that is dependent on an orientation of surfaces on which the insulation layer 6 is to be deposited. The deposition process may have a higher deposition rate on horizontal surfaces than on vertical surfaces. In one embodiment, the deposition process is a high density plasma (HDP) process to form the insulation layer 6 as a HDP-oxide-layer (High Density Plasma-oxide layer). The thickness of the insulation layer 6 that is deposited on horizontal surfaces, like on the gate electrodes 2 and the gate contact electrode 2' is, for example, between about 200 nm and 600 nm, more typically between about 250 nm and 400 nm, for example about 300 nm. HDP processes are plasma supported deposition/sputter processes that are commonly known, so that no further explanations are required. The insulation layer 6 may however also be formed by conformal deposition.

Figure 6:
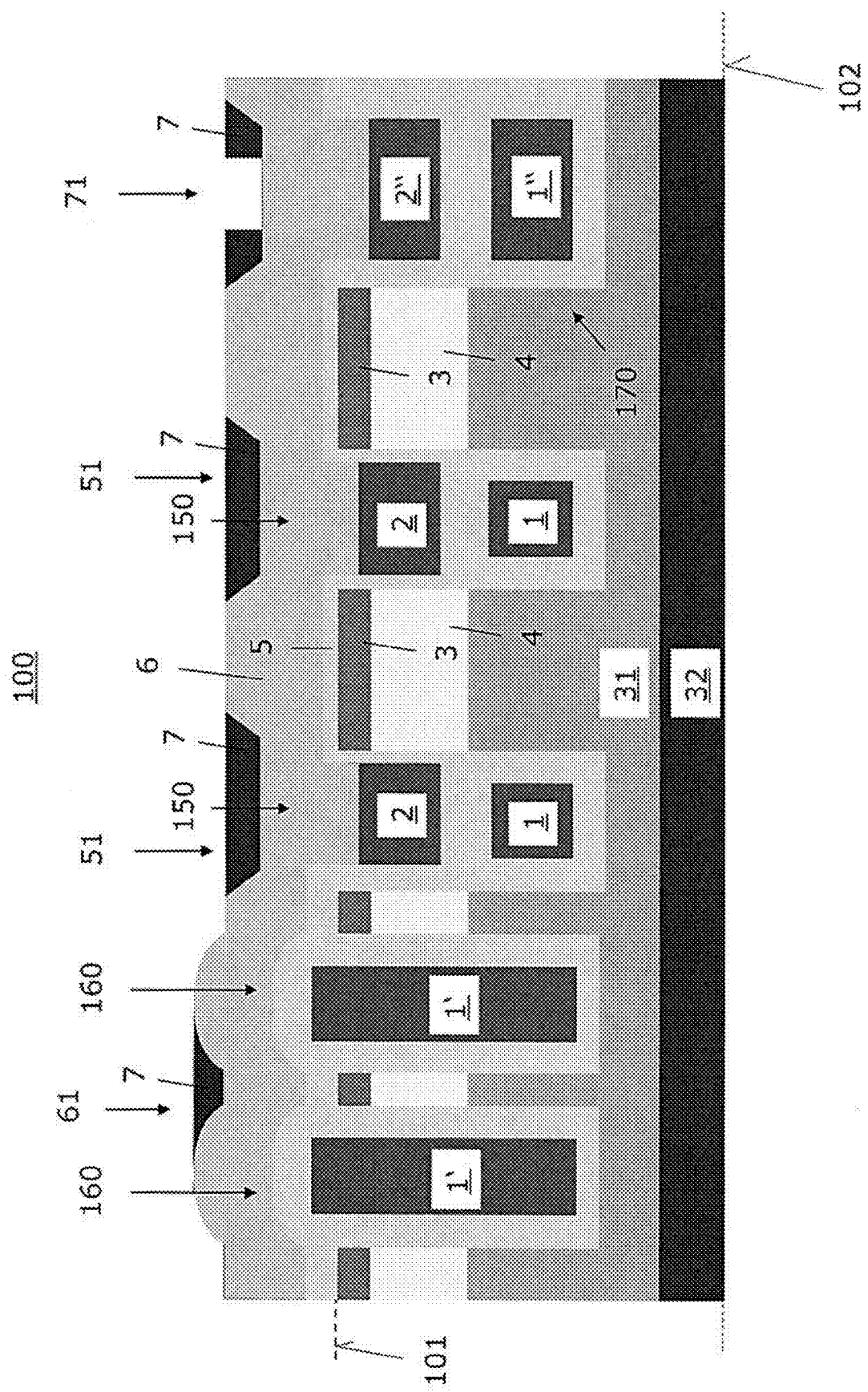

Referring to FIG. 6, a further polycrystalline semiconductor layer 7, typically a poly-silicon layer is deposited on the insulation layer 6 and anisotropically etched to partly recess the insulation layer 6 in the recess 71 above the third vertical trench 170. For the purpose, the polycrystalline semiconductor layer 7 is typically deposited with a minimum height, in the vertical cross-section, that is lower than about the half of the width of the recess 71 above the third vertical trench 170. The polycrystalline semiconductor layer 7 is however typically deposited with a minimum height that is larger than about half of a width of the first recess 51. As the width of the first vertical trenches 150 in the shown vertical cross-section is typically smaller that the width of the third vertical trench 170, the width of the recess 61 above the first vertical trenches 150 is, in the vertical cross-section, also smaller compared to the width of the recess 71 above the third vertical trench 170. Accordingly, the insulation layer 6 is not exposed below the recess 51 above the first vertical trenches 150 by anisotropic etching. The same also applies to a portion of the insulation layer 6 below the recess 61 of the insulation layer 6 formed between the two protrusions above the second vertical trenches 160. The remaining portions of the further polycrystalline semiconductor layer 7 are removed by the anisotropic etching process. Accordingly, the insulation layer 6 above mesa regions in the active area is at least partially exposed. This allows forming contacts to the mesa regions which are self-aligned to the first vertical trenches 150 by using the remaining portions of the further polycrystalline semiconductor layer 7 as etching mask. This will explained below in more detail.

According to embodiments, the insulation layer 6 is deposited on the first surface 101 such that the insulation layer 6 has a first recess 51 above the gate electrode 2, a second recess 71 above the gate contact electrode 2" and a protrusion above the first contact electrode 1'. In embodiments with two neighbouring first contact electrodes 1', a third recess 61 is typically formed between the two protrusions above the neighboring second vertical trenches 160 and first contact electrodes 1', respectively. A mask layer 7, typically a poly-silicon layer, is deposited on the insulation layer 6 which is selectively etchable with respect to the insulation layer 6. The mask layer 7 is etched with respect to the insulation layer 6 such that the insulation layer 6 is partly recessed on the protrusion and in a central portion of the second recess 71 while the insulation layer 6 beneath the first recess 51 remains covered by the mask layer 7. The etching mask layer 7 typically includes an anisotropic etching process.

Figure 7:
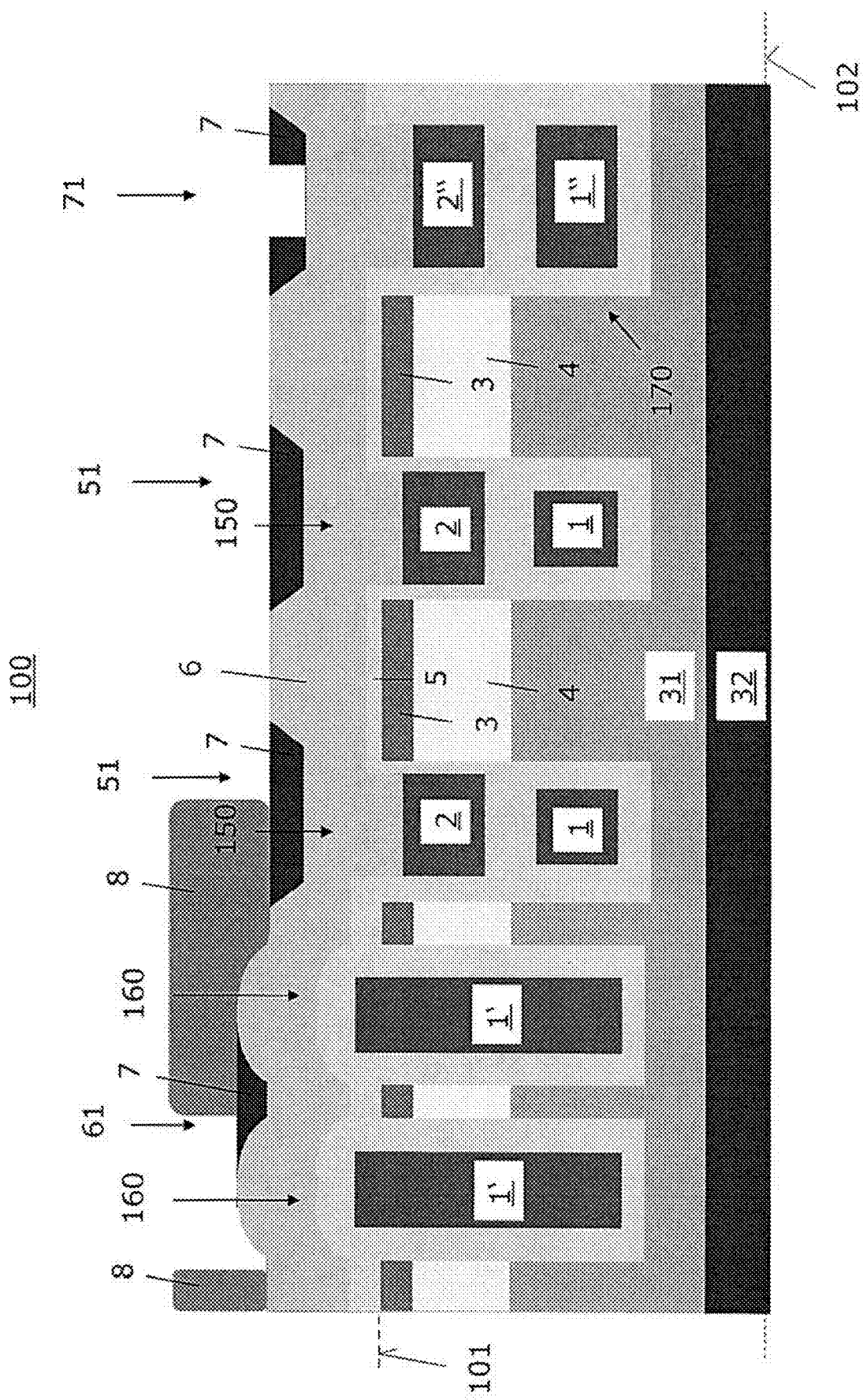

Referring to FIG. 7, an additional mask 8 is formed on the first surface 101. In the exemplary embodiment, the additional mask 8 covers partly a remaining portion of the polycrystalline semiconductor layer 7 filling the third recess 61 formed between the two protrusions above the neighboring second vertical trenches 160 and extends to a remaining portion of the polycrystalline semiconductor layer 7 filling the first recess 51 above the left first vertical trench 150.

Figure 8:
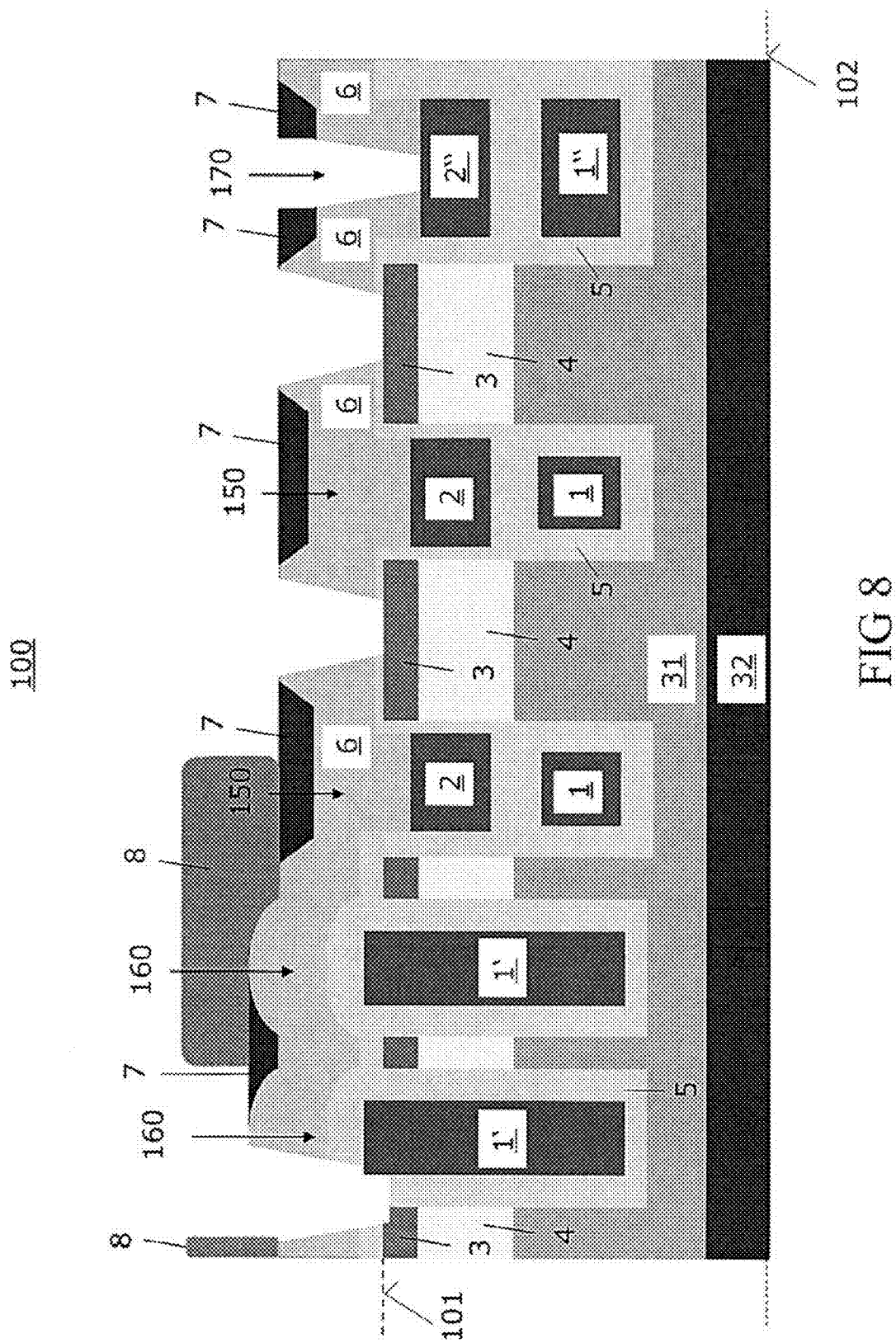

Referring to FIG. 8, a masked etching process using the additional mask 8 and remaining portions of the polycrystalline semiconductor layer 7 as an etching mask is used to expose the first conductive region 1' in the left of the two second vertical trenches 160, the mesa between the first vertical trenches 150, the mesa between the third vertical trench 170 and the neighboring first vertical trench 150 and the gate contact electrode 2". For example, an oxide etching process may be used to remove portions of the insulation layer 6 and the dielectric region 5.

According to an embodiment, the etched polycrystalline semiconductor layer 7 is used as an etching mask and part of the etching mask, respectively, to expose the gate contact electrode 2", mesas next to the first vertical trenches 150 and the first conductive region 1' in the second vertical trench 160.

In the exemplary embodiment, the semiconductor body 40 is exposed in the active area next to the first vertical trenches 150 during the masked etching process. In doing so, openings above the source regions 3 or emitter regions 3 next to the first vertical trenches 150 are formed in self-aligned manner with respect to the first vertical trenches 150 without the need of a high precision mask and a respective deep UV-process. The alignment requirements of the additional mask 8 are comparatively low. For example, the additional mask 8 may be shifted in the horizontal direction in the cross-section illustrated in FIG. 8 without affecting forming the openings above the source regions 3 or emitter regions 3 and recessing the first conductive regions 1'. Furthermore, a further contact layer with tight alignment tolerances is not required. Accordingly, gate contacts and source contacts or emitter contacts may reliably and cost-effectively be formed as illustrated with regard to FIG. 9.

Figure 9:
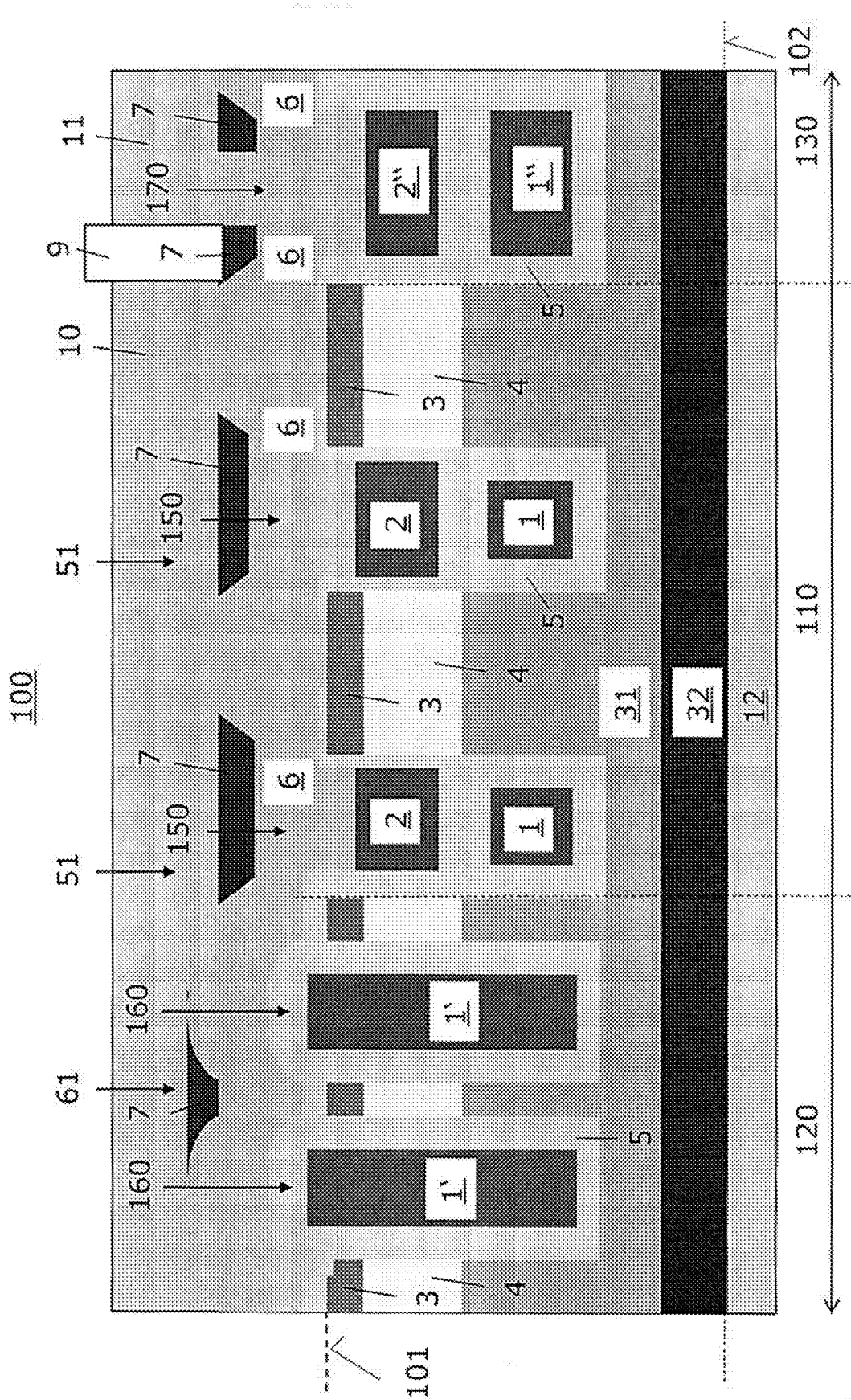

FIG. 9 illustrates the semiconductor device 100 after further processes of removing the additional mask 8, forming on the first surface 101 a first metallization 10 in electric contact with the first conductive region 1', forming a first contact electrode 1' or emitter contact electrode 1' in the left second vertical trench 160 and with the source regions 3 or emitter regions 3 in the active area 110, forming on the first surface 101 a second or gate metallization 11 in electric contact with the second conductive region 2" forming a gate contact electrode in the third vertical trench 170, and forming a third metallization 12 arranged opposite the a first metallization 10. Typically, the first metallization 10 is also in electric contact with the body regions 4 via body contact regions (not shown). For example, body contact regions may be formed by etching through the semiconductor regions 3 partly into the body regions 4 and out-diffusion of dopants.

Forming the first and second metallizations 10, 11 typically includes a common deposition process followed by partial recessing and forming an insulating plug 9 between the first and second metallizations 10, 11.

Depending on whether a pn-junction is formed between the drift region 31 and semiconductor layer 32, the first contact electrode 1', the first metallization 10 and the third metallization 12 may form an emitter contact electrode 1' or a source contact electrode 1', an emitter metallization 10 or a source metallization 10, and a collector metallization 12 or a drain metallization 12, respectively. Accordingly, the semiconductor device 100 may form an IGBT or a MOSFET.

According to an embodiment, the semiconductor transistor 100 includes an active area 110 with at least a first vertical trench 150 extending from the first surface 101 into a semiconductor body 40 and having in a lower portion a field electrode 1 and in an upper portion a gate electrode 2. In a first contact area 120 at least a second vertical trench 160 extends from the first surface 101 into the semiconductor body 40 and includes a first contact electrode 1' extending above the first surface 101 for contacting the field electrode 1. In a second contact area 130 a third vertical trench 170 extends from the first surface 101 into the semiconductor body 40 and includes in a lower in an upper portion a gate contact electrode 2" of contacting the gate electrode 2. The field electrode 1, gate electrode 2, the first contact electrode 1' and the gate contact electrode 2" are separated from the semiconductor body 40 by one or more dielectric regions 5. Typically, the field electrode 1 and the first contact electrode 1' are formed by a common conductive region. Further, the gate electrode 2 and the gate contact electrode 2" are typically formed by another common conductive region.

In a vertical cross-section, a width of the third vertical trench 170 is typically larger than a respective width of the first and/or the second vertical trench 160, 170.

Typically, an HDP-oxide layer 6 is partly arranged in the at least one first vertical trench 150 and in the third vertical trench 170 and extends above the first surface 101. The HDP-oxide layer 6 has at least one of a protrusion above the first contact electrode 1', a first recess 51 above the gate electrode 2, and an opening having a through contact to the gate contact electrode 2".

In the exemplary embodiment, illustrated in FIG. 9, two second vertical trenches 160 are formed and a further recess 61 of the HDP-oxide layer 6 is formed between the two protrusions. Accordingly, the further recess 61 of the HDP-oxide layer 6 is formed above a mesa of the semiconductor body 40 which is arranged between the two second vertical trenches 160.

Figure 10:
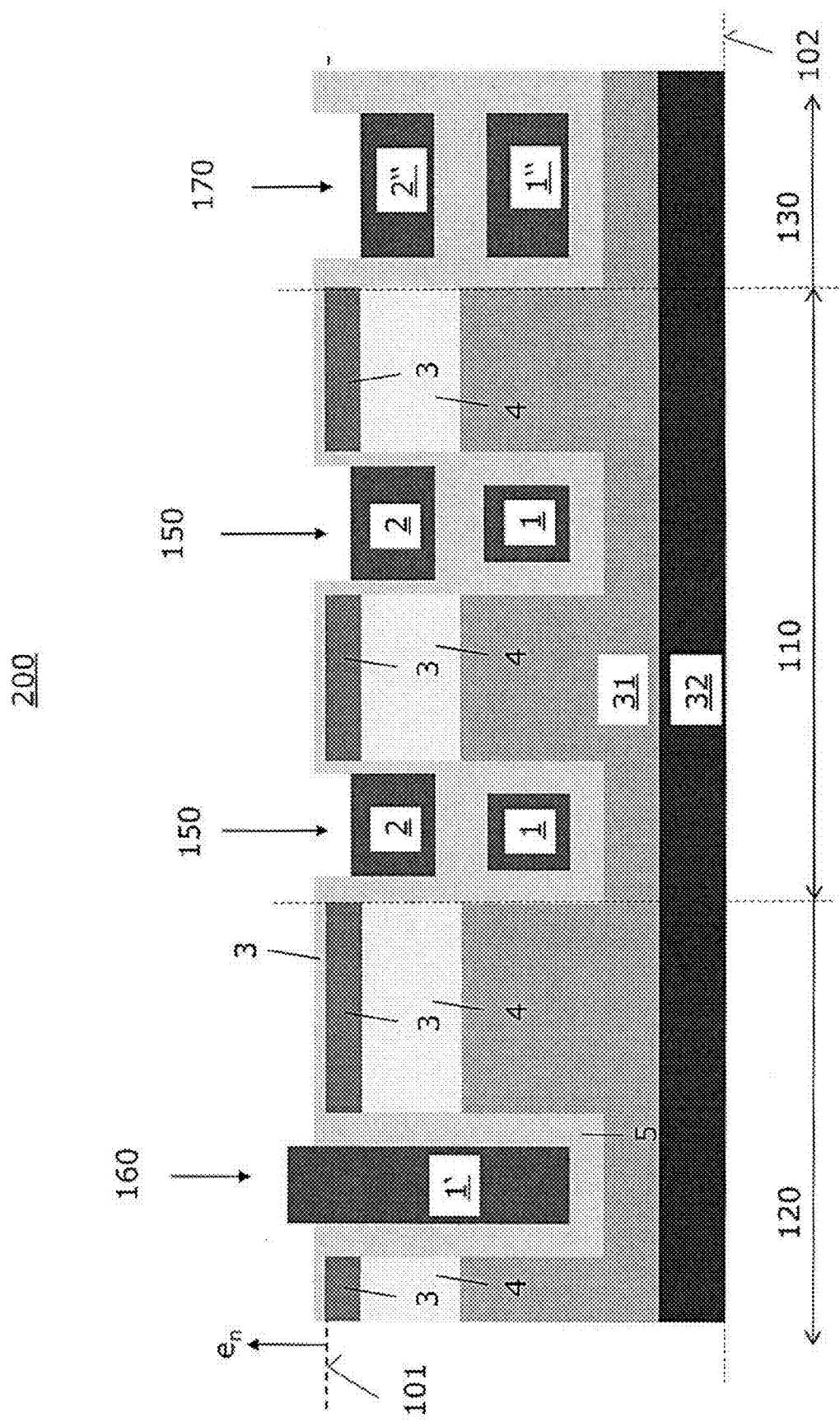
FIGS. 10 to 15 illustrate vertical cross-sections through a semiconductor body during method steps of a method according to further embodiments.

FIGS. 10 to 15 illustrate a method for forming a semiconductor device 200 according to several embodiments in vertical cross-sections. The first process for forming the semiconductor device 200 is similar as explained above with regard to FIGS. 1 to 4 for the semiconductor device 100. However, only one second vertical trench 160 is formed in the first contact area 120 as illustrated in FIG. 10. Furthermore, an uppermost portion of the first conductive region 1' formed in the second vertical trench 160 and extending above the first surface 101 is exposed, i.e. not covered by a dielectric or layer.

Figure 11:
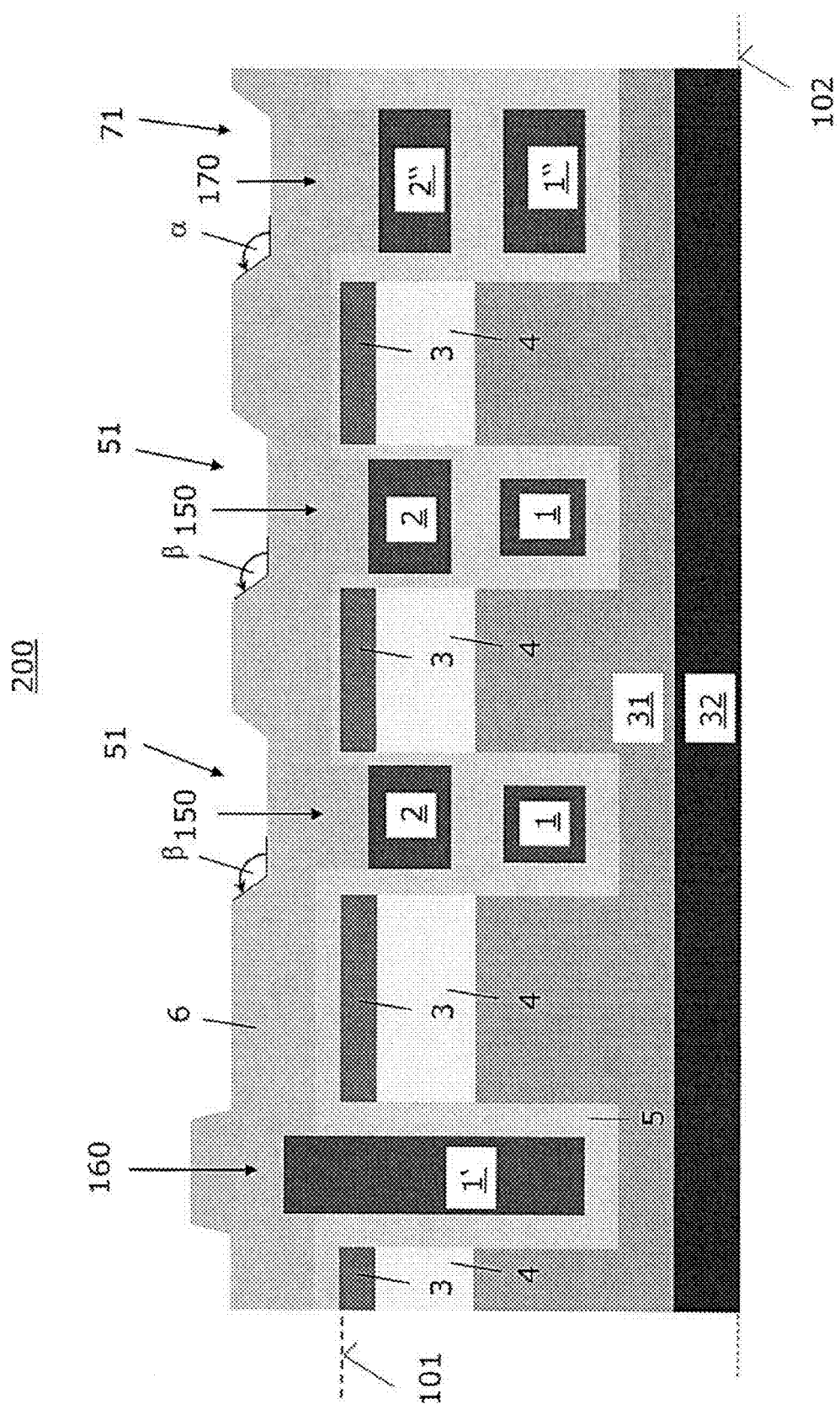

Referring to FIG. 11, an insulation layer 6 is formed on the first conductive region 1' forming a first contact electrode 1', on the gate electrode 2, on the gate contact electrode 2" and on the first surface 101 so that the insulation layer 6 has first and second recesses 51, 71 above the gate electrode 2 and the gate contact electrode 2", respectively, and a protrusion above the first contact electrode 1. The insulation layer 6 may be formed as explained above with regard to FIG. 5. For example, the insulation layer 6 is typically formed as a HDP-oxide layer.

Figure 12:
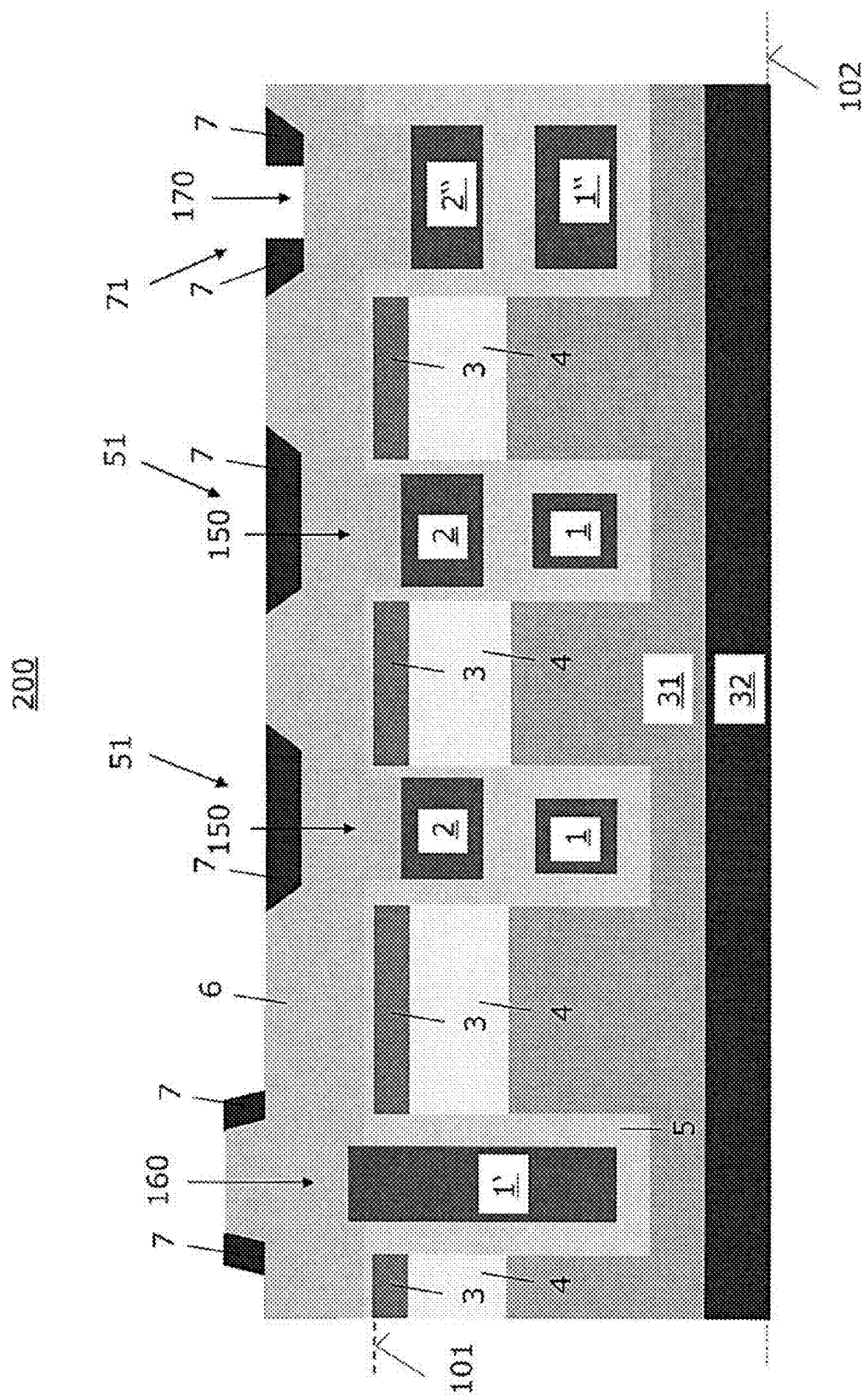

Referring to FIG. 12, a further polycrystalline semiconductor layer 7, typically a poly-silicon layer is deposited on the insulation layer 6 and anisotropically etched to partly recess the insulation layer 6 in the recess 71 above the third vertical trench 170. Similar as explained above with regard to FIG. 6, this is carried out such that the polycrystalline semiconductor layer 7 is also removed from other portions of the insulation layer 6 except the first recesses 51 above the gate electrodes 2 and portions next to the sidewalls of the protrusion above the second vertical trench 160.

Figure 13:
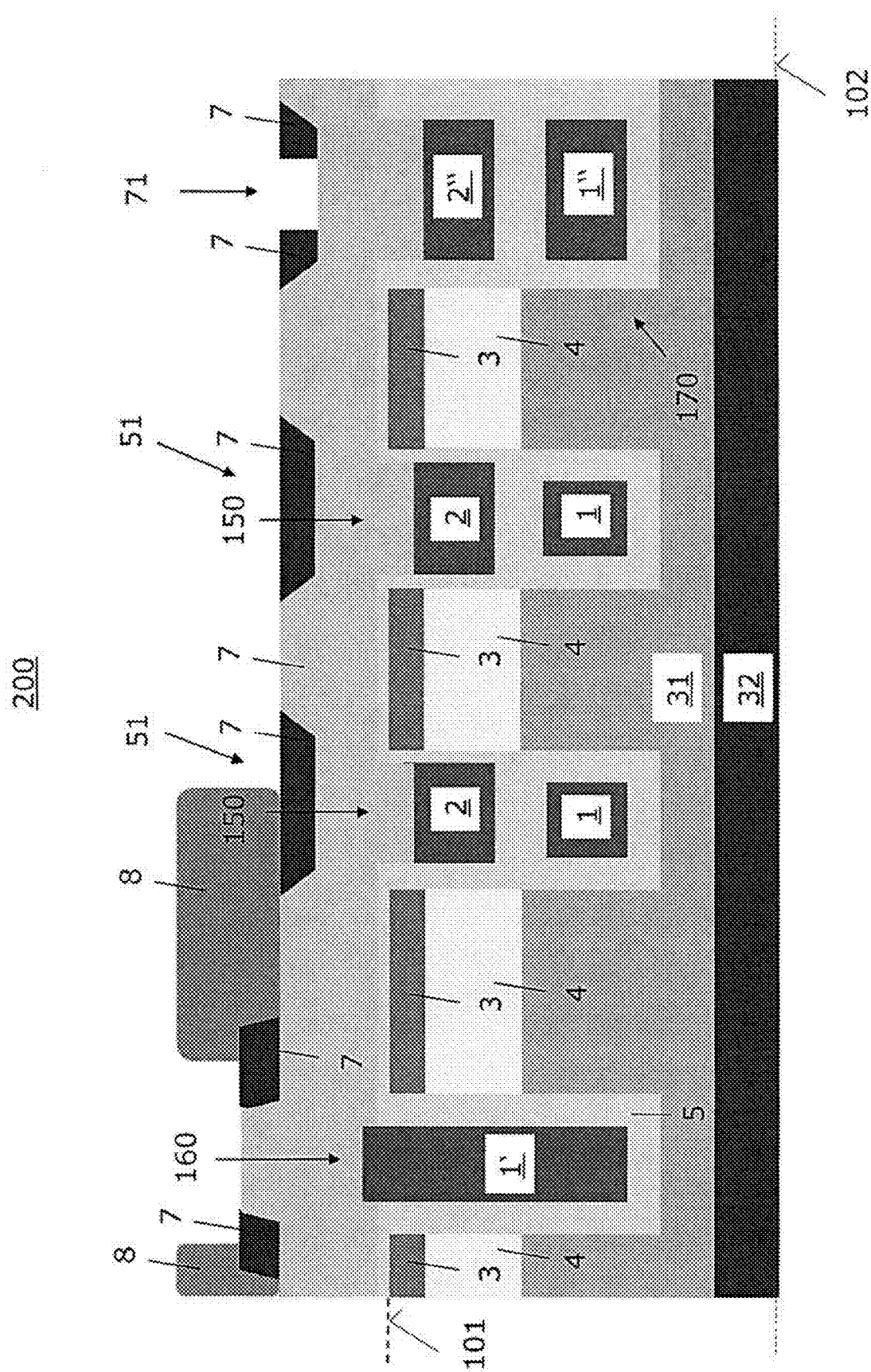

Referring to FIG. 13, an additional mask 8 with comparatively low alignment requirements is formed on the first surface 101. In the exemplary embodiment, the additional mask 8 covers partly a remaining portion of the polycrystalline semiconductor layer 7 next to the sidewalls of the protrusion above the second vertical trench 160 and extends to a remaining portion of the polycrystalline semiconductor layer 7 filling the first recess 51 of the left first vertical trench 150. Accordingly, the insulation layer 6 above the mesa region between the second vertical trench 160 and the left first vertical trench 150 is also covered by the additional mask 8.

Figure 14:
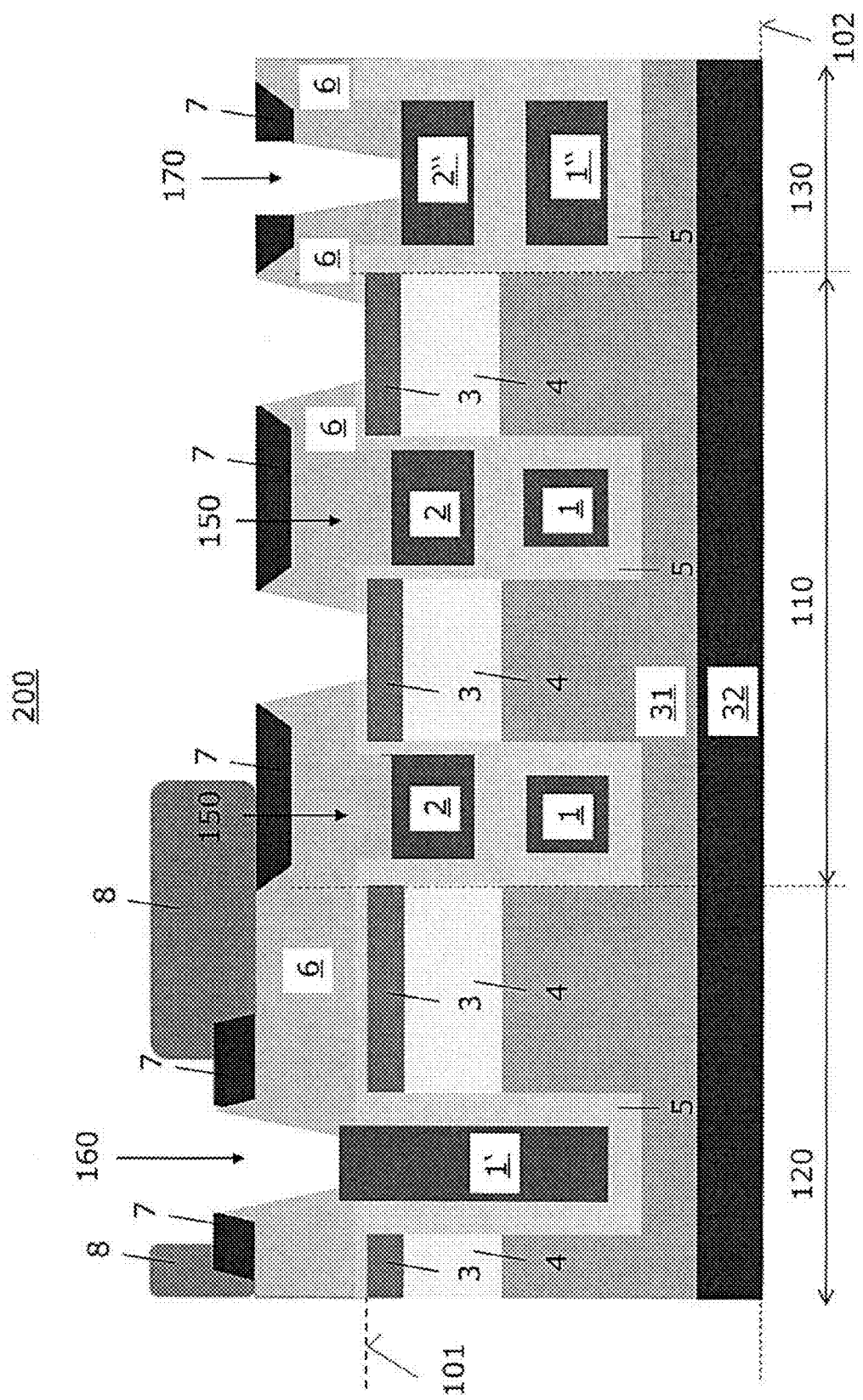

Referring to FIG. 14, a masked etching process using the additional mask 8 and remaining portions of the polycrystalline semiconductor layer 7 as an etching mask is used to expose the first conductive regions 1' of the second vertical trench 160 and the semiconductor mesa in the active area 110. For example, an oxide etching process may be used to remove portions of the insulation layer 6 and the dielectric region 5. Accordingly, contacts to the mesa of the active area 110 are formed self-aligned to the first vertical trenches 150 without using an additional high precision deep UV process. Thus, manufacturing costs may be saved.

Figure 15:
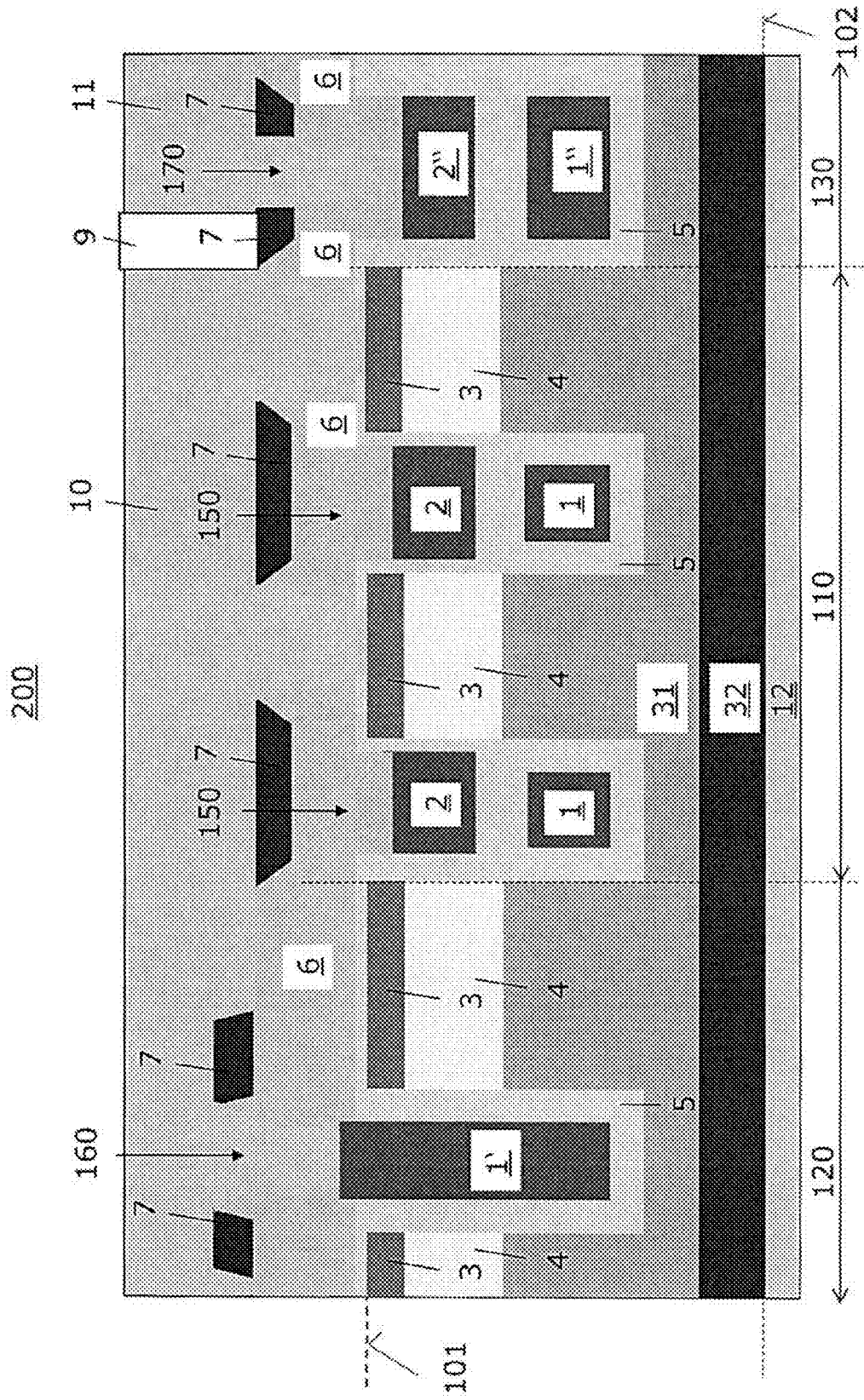

The remaining processes for producing the semiconductor device 200 are similar as explained above with regard to FIGS. 7 to 9 for the semiconductor device 100. The processed semiconductor device 200 illustrated in FIG. 15 is typically also a MOSFET or an IGBT.

The methods explained above with regard to FIGS. 1 to 9 and 10 to 15, respectively, have in common that vertical trenches, in particular insulated vertical trenches, of different width are formed in the active area and the contact areas. This allows for self aligned forming of trenches and contacts to the mesas in the active area without additional high precision deep UV process. As one lithography step for contacting source and gate is saved, manufacturing cost may be reduced.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for producing a semiconductor transistor component, comprising:

providing a semiconductor body with a first surface defining a vertical direction;

defining an active area, a first contact area and a second contact area;

forming vertical trenches in the semiconductor body so that, in a vertical cross-section, a first vertical trench, a second vertical trench and a third vertical trench extend from the first surface into the semiconductor body, the first vertical trench being formed in the active area, the second vertical trench being formed in the first contact area, and the third vertical trench being formed in the second contact area;

forming respective first conductive regions in the second vertical trench and in a lower portion of the first vertical trench so that the first conductive region in the second vertical trench extends above the first surface;

forming respective second conductive regions in an upper portion of the first vertical trench and in an upper portion of the third vertical trench;

forming an insulation layer in the first vertical trench, in the third vertical trench and on the first surface so that the insulation layer has a first recess above the second conductive region of the first vertical trench, a second recess above the second conductive region of the third vertical trench and a protrusion above the first conductive region of the second vertical trench;

depositing a polycrystalline semiconductor layer on the insulation layer; and anisotropic etching the polycrystalline semiconductor layer to partly recess the insulation layer in the second recess while the insulation layer beneath the first recess remains covered.

2. The method of claim 1, further comprising etching the insulation layer using the anisotropic etched polycrystalline semiconductor layer as an etching mask to expose at least one of the second conductive region of the third vertical trench and a mesa next to the first vertical trench.

3. The method of claim 1, wherein the polycrystalline semiconductor layer is, in the vertical cross-section, deposited with a minimum height that is lower than about half of a width of the second recess.

4. The method of claim 1, wherein the vertical trenches are formed such that the first vertical trench has, in the vertical cross-section, a first width, and wherein the third vertical trench has, in the vertical cross-section, a third width larger than the first width.

5. The method of claim 4, wherein the third width is larger than about twice the first width.

6. The method of claim 1, wherein the vertical trenches are formed such that the second vertical trench has, in the vertical cross-section, a second width, and wherein the third vertical trench has, in the vertical cross-section, a third width larger than the second width.

7. The method of claim 1, wherein the second recess comprises, in the vertical cross-section, a bottom wall and a side wall forming with the bottom wall an angle in a range from about 120° to about 150°.

8. The method of claim 1, wherein the first contact area and/or the second contact area are defined in a peripheral area of the semiconductor body.

9. The method of claim 1, wherein the insulation layer is formed as a HDP-oxide.

10. The method of claim 1, wherein the polycrystalline semiconductor layer is deposited with a vertical height of about 150 nm to about 600 nm.

11. The method of claim 1, further comprising:

forming an additional mask partly covering remaining portions of the anisotropic etched polycrystalline semiconductor layer next to the second vertical trench; and etching the insulation layer using the additional mask and the remaining portions of the anisotropic etched polycrystalline semiconductor layer as an etching mask to expose the first conductive regions of the second vertical trench, the second conductive region of the third vertical trench and a mesa next to the first vertical trench.

12. The method of claim 1, wherein the first vertical trench, the second vertical trench and the third vertical trench are formed as portions of a common trench.

13. The method of claim 1, further comprising at least one of:

forming on the first surface a first metallization in electric contact with the first conductive region in the second vertical trench;

forming on the first surface a second metallization in electric contact with the second conductive region in the third vertical trench; and forming a third metallization arranged opposite the first metallization.

14. The method of claim 13, wherein the first metallization is in electric contact with a semiconductor mesa in the active area next to the first vertical trench.

15. The method of claim 1, further comprising, prior to forming the insulation layer, forming a first pn-junction and a second pn-junction which extend at least in the active area substantially parallel to the first surface.

16. A method for producing a semiconductor transistor, comprising:

providing a semiconductor arrangement comprising a semiconductor body with a first surface;

forming a first vertical trench, a second vertical trench and a third vertical trench from the first surface into the semiconductor body so that, in a vertical cross-section which is substantially orthogonal to the first surface, the first vertical trench has a first width, the second vertical trench has a second width, and the third vertical trench has a third width which is larger than at least one of the first width and the second width;

forming a first contact electrode in the second vertical trench that extends above the first surface;

forming at least in a lower portion of the first vertical trench a field electrode that is, in the vertical cross-section, completely insulated, wherein the first contact electrode and the field electrode are formed by a common process of depositing a conductive material;

forming a gate electrode in an upper portion of the first vertical trench and a gate contact electrode in an upper portion of the third vertical trench;

depositing an insulation layer on the first surface so that the insulation layer comprises a first recess above the gate electrode, a second recess above the gate contact electrode and a protrusion above the first contact electrode;

depositing a mask layer on the insulation layer which is selectively etchable with respect to the insulation layer; and etching the mask layer with respect to the insulation layer such that the insulation layer is partly recessed on the protrusion and in a central portion of the second recess while the insulation layer beneath the first recess remains covered by the mask layer.

17. The method of claim 16, further comprising etching the insulation layer using the etched mask layer as an etching mask to expose at least one of the gate contact electrode and a mesa next to the first vertical trench.

18. The method of claim 16, wherein etching the mask layer comprises an anisotropic etching process.

19. The method of claim 16, wherein forming the gate electrode and the gate contact electrode comprises at least one of: depositing poly-silicon; and a common back-etching process.

20. The method of claim 16, further comprising at least one of:

forming an additional mask on the first surface next to the second vertical trench after etching the mask layer; and etching the insulation layer selectively to the polycrystalline semiconductor layer and the mask to expose the first contact electrode in the second vertical trench and the gate contact electrode in the third vertical trench.

21. A semiconductor transistor, comprising a semiconductor body with a first surface defining a vertical direction, and in a vertical cross-section the semiconductor transistor further comprising:
- an active area comprising at least a first vertical trench extending from the first surface into the semiconductor body and comprising in a lower portion a field electrode and in an upper portion a gate electrode, the at least one first vertical trench having a first width;
- a first contact area comprising at least a second vertical trench extending from the first surface into the semiconductor body, the at least one second vertical trench having a second width, and a first contact electrode that extends above the first surface and is in electric contact with the field electrode;
- a second contact area comprising a third vertical trench extending from the first surface into the semiconductor body, the third vertical trench comprising in an upper portion a gate contact electrode in electric contact with the gate electrode, the third vertical trench having a third width which is larger than at least one of the first width and the second width; and
- an HDP-oxide partly arranged in the at least one first vertical trench and in the third vertical trench and has at least one of a protrusion above the first contact electrode, a first recess above the gate electrode, and a second recess above the gate contact electrode,
- wherein the first contact area comprises two second vertical trenches, and wherein a further recess of the HDP-oxide is formed above a mesa of the semiconductor body between the two second vertical trenches.

22. The semiconductor transistor of claim 21, wherein the gate contact electrode has a larger minimum distance to the first surface than the gate electrode.

23. The semiconductor transistor of claim 21, wherein the first contact area and/or the second contact area are formed in a peripheral area of the semiconductor body.

* * * * *